United States Patent
Miller et al.

(10) Patent No.: US 8,859,063 B2
(45) Date of Patent: *Oct. 14, 2014

(54) SYSTEMS AND METHODS FOR A PROTECTIVE CASING

(75) Inventors: David Lowell Miller, Kirkland, WA (US); Gary Kersten, Duvall, WA (US); Wendell A. Frost, Renton, WA (US)

(73) Assignee: Honeywell International Inc., Morristown, NJ (US)

(*) Notice: Subject to any disclaimer, the term of this patent is extended or adjusted under 35 U.S.C. 154(b) by 106 days.

This patent is subject to a terminal disclaimer.

(21) Appl. No.: 13/552,243

(22) Filed: Jul. 18, 2012

(65) Prior Publication Data

US 2014/0020878 A1    Jan. 23, 2014

(51) Int. Cl.
*B32B 1/02* (2006.01)
*B32B 1/08* (2006.01)
*B32B 5/24* (2006.01)
*B32B 15/08* (2006.01)
*D03D 15/00* (2006.01)
*D04H 1/00* (2006.01)

(52) U.S. Cl.
USPC ....... 428/35.3; 428/34.4; 428/34.5; 428/34.6; 428/34.7; 428/35.2; 428/35.7; 428/35.8; 428/35.9; 428/36.1; 428/36.4; 442/2; 442/30; 442/49; 442/50; 442/56; 442/221; 442/286

(58) Field of Classification Search
CPC ............ B32B 1/02; B32B 5/02; B32B 5/022; B32B 5/024; B32B 5/18; B32B 5/245; B32B 5/26; B32B 5/28; B32B 15/02; B32B 15/08; B32B 27/04; B32B 27/12; B65D 15/00; B65D 85/30; B65D 85/38; B65D 90/02; H05K 5/2013

USPC ............... 428/34.4–34.7, 34.9, 35.2–35.4, 428/35.7–36.91; 442/2, 6, 9, 30, 49, 50, 52, 442/56, 221, 286; 165/185
See application file for complete search history.

(56) References Cited

U.S. PATENT DOCUMENTS

| 4,428,998 | A | * | 1/1984 | Hawkinson | 442/263 |
| 4,600,449 | A | | 7/1986 | White et al. | |
| 4,944,401 | A | | 7/1990 | Groenewegen | |
| 5,123,538 | A | | 6/1992 | Groenewegen | |
| 5,438,162 | A | | 8/1995 | Thompson et al. | |

(Continued)

OTHER PUBLICATIONS

"Flight Autonomous Event Recorder Information Technology Open (FAERITO) Digital Data Download (D3) [Abstract only]", Feb. 4, 2002-Aug. 4, 2004, pp. 1-3, Publisher: Physical Optics Corporation.

(Continued)

*Primary Examiner* — Walter B Aughenbaugh
(74) *Attorney, Agent, or Firm* — Fogg & Powers LLC

(57) ABSTRACT

Systems and methods for a protective casing are provided. In at least one embodiment, a protective casing includes a flexible insulation layer configured to inhibit thermal energy from conducting from an external side of the flexible insulation layer to an internal side of the flexible insulation layer. The protective casing also includes a microlattice layer abutting the internal side of the flexible insulation layer, the microlattice layer configured to distribute thermal energy that passes through the flexible insulation layer substantially throughout the microlattice layer. Further, the protective casing includes a heat absorbing material that impregnates the microlattice layer, the heat absorbing material configured to absorb the thermal energy in the microlattice layer.

9 Claims, 4 Drawing Sheets

(56) References Cited

U.S. PATENT DOCUMENTS

| | | | |
|---|---|---|---|
| 5,708,565 | A | 1/1998 | Fairbanks |
| 5,760,336 | A | 6/1998 | Wang |
| 5,859,765 | A | 1/1999 | Grewe |
| 5,932,839 | A | 8/1999 | Ren et al. |
| 6,040,526 | A | 3/2000 | Olzak |
| 6,078,011 | A | 6/2000 | Ren et al. |
| 6,184,464 | B1 | 2/2001 | Liptak et al. |
| 6,899,161 | B2 | 5/2005 | Ren et al. |
| 7,382,959 | B1 | 6/2008 | Jacobsen |
| 7,653,276 | B1 | 1/2010 | Gross et al. |
| 7,875,812 | B2 | 1/2011 | Steffler |
| 8,089,807 | B1 | 1/2012 | Steffler |
| 8,155,496 | B1 | 4/2012 | Cumberland et al. |
| 8,723,057 | B2 | 5/2014 | Miller et al. |
| 2011/0195363 | A1 | 8/2011 | Rock et al. |
| 2014/0020878 | A1 | 1/2014 | Miller et al. |
| 2014/0022722 | A1 | 1/2014 | Miller et al. |

OTHER PUBLICATIONS

Shankland, "Breakthrough Material is Barely More Than Air", Nov. 18, 2011, pp. 1-3, Publisher: http://news.cnet.com/8301-30685_3-57327382264/breakthrough-material-is-barely-more-than-air/ Dec. 2, 2011 11:32:01 AM.

Miller et al., "Systems and Methods for Protecting a Flight Recorder", "U.S. Appl. No. 13/552,275", Jul. 18, 2012, pp. 1-19, Published in: US.

U.S. Patent and Trademark Office, "Office Action", "from U.S. Appl. No. 13/552,275", Nov. 8, 2013, pp. 1-11, Published in: US.

Aspen Aerogels, Inc., "Pyrogel XTF Data Sheet", 2010, pp. 1-2, Publisher: Aspen Aerogels, Inc.

U.S. Patent and Trademark Office, "Office Action", "from U.S. Appl. No. 13/552,243", Feb. 14, 2014, pp. 1-22, Published in: US.

U.S. Patent and Trademark Office, "Notice of Allowance", "from U.S. Appl. No. 13/552,275", Mar. 20, 2014, pp. 1-11, Published in: US.

\* cited by examiner

SYSTEMS AND METHODS FOR A PROTECTIVE CASING

CROSS-REFERENCE TO RELATED APPLICATIONS

This application is related to the following co-pending United States patent application, which is hereby incorporated herein by reference:

U.S. patent application Ser. No. 13/552,275 entitled "SYSTEMS AND METHODS FOR PROTECTING A FLIGHT RECORDER" filed on even date herewith and which is referred to herein as the '156 application.

BACKGROUND

Certain environments and events cause extreme conditions that are not present in a normal environment. In particular, certain environments and events can cause objects in that environment to experience extreme shocks, temperatures, and exposure to liquid such that the object can be damaged. For example, data gathering instruments, that are susceptible to the extreme forces in the environment, may need to pass through these extreme environments in order to acquire and preserve the data for which the data gathering instruments are designed. Further, at times humans may need to pass through extreme environments that could potentially be lethal. To withstand these extreme conditions, objects can be insulated from the heat by relatively brittle insulating materials and relatively uncompressible heat absorbing materials. Generally, the insulating material surrounds a layer of heat absorbing material, where the heat absorbing material surrounds the data gathering instrument. Further, in certain situations, due to the brittleness and incompressibility of the insulating and heat absorbing material, an object is enclosed in heavy-gauge hardened steel to provide protection against shocks.

Due to the weight of the steel, an optimization process is used to reduce the total enclosed volume and weight of the enclosure while still providing the desired protection against extreme conditions. However, optimization of the enclosure geometry for structural robustness and practical limitations on the dimensions of the data storage device lead to uneven distribution of insulation and/or heat absorbing material. Further, in certain embodiments, a steel enclosure accounts for approximately 65% of the weight of the protective covering enclosing the protected object.

SUMMARY

Systems and methods for a protective casing are provided. In at least one embodiment a protective casing includes a flexible insulation layer configured to inhibit thermal energy from conducting from an external side of the flexible insulation layer to an internal side of the flexible insulation layer. The protective casing also includes a microlattice layer abutting the internal side of the flexible insulation layer, the microlattice layer configured to distribute thermal energy that passes through the flexible insulation layer substantially throughout the microlattice layer. Further, the protective casing includes a heat absorbing material that impregnates the microlattice layer, the heat absorbing material configured to absorb the thermal energy in the microlattice layer.

BRIEF DESCRIPTION OF THE DRAWINGS

Features of the present invention will become apparent to those skilled in the art from the following description with reference to the drawings. Understanding that the drawings depict only typical embodiments and are not therefore to be considered limiting in scope, the invention will be described with additional specificity and detail through the use of the accompanying drawings, in which.

DETAILED DESCRIPTION

In the following detailed description, embodiments are described in sufficient detail to enable those skilled in the art to practice the invention. It is to be understood that other embodiments may be utilized without departing from the scope of the invention. The following detailed description is, therefore, not to be taken in a limiting sense.

Embodiments of the present disclosure provide methods and systems for providing protection to objects in environments with extreme conditions, such as the extreme conditions present during an aircraft disaster.

Figure 1:
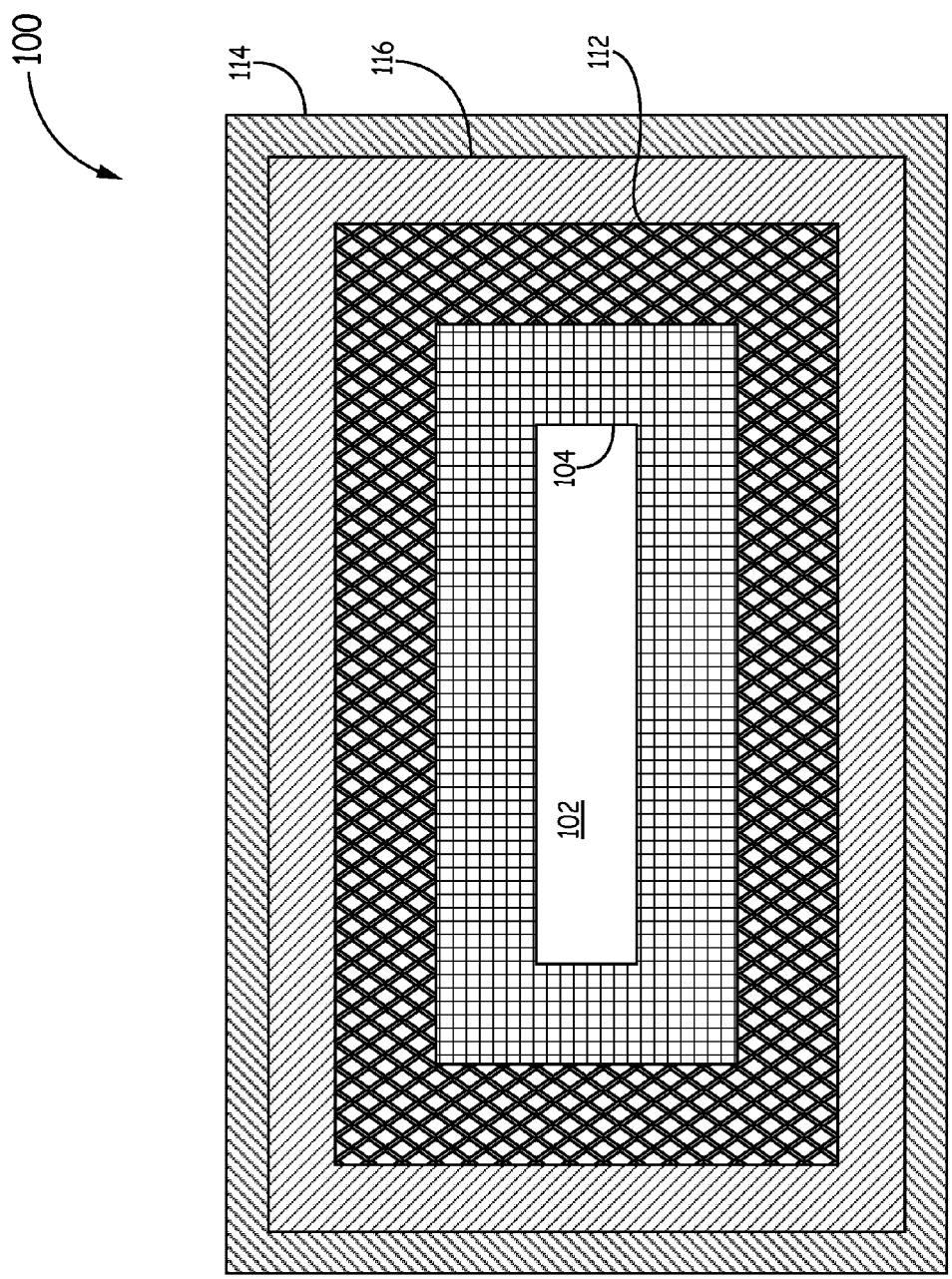
FIG. 1 is a block diagram illustrating a cross section of a protective casing according to one embodiment.

FIG. 1 is a diagram illustrating the components of a protective casing 100 according to one embodiment. Protective casing 100 includes components that provide protection in extreme environments within a protection compartment 102. For example, protective casing 100 can provide protection to data gathering instruments such as a memory unit for a flight data recorder, a scientific instrument, or a safe. When protective casing 100 provides protection to a memory unit for a flight data recorder, during normal operation of the memory unit, the memory unit is connected to a communication cable that extends through the protective casing 100. In an alternative implementation, when protective casing 100 provides protection to data gathering instruments, the portion of the instrument contained within protection compartment 102 is connected to an external portion of the data gathering instrument that is external to protective casing 100. Because objects within the protection compartment 102 can be susceptible to damage caused by shocks, heat, and exposure to liquids, the protective casing 100 includes protective structures that inhibit heat and shocks from affecting the objects inside the protection compartment. For example, as illustrated in FIG. 1, the protective casing 100 can include an inner metallic microlattice layer 112, a flexible insulation layer 116 surrounding microlattice layer 112, and an outer protective layer 114 surrounding insulation layer 116. In at least one embodiment, the protective casing 100 includes heat absorption material 104 within microlattice layer 112 that surrounds the protection compartment 102.

Microlattice layer 112 is a layer that encapsulates the protective casing in a metallic microlattice. In some embodiments, the metallic microlattice is a three-dimensional microstructure. In further embodiments, the microlattice is a structure that can be used as a supporting scaffolding in an apparatus for storing thermal energy, where the microlattice layer 112 includes a thermal storage material and the microlattice supporting scaffolding.

Figure 2:
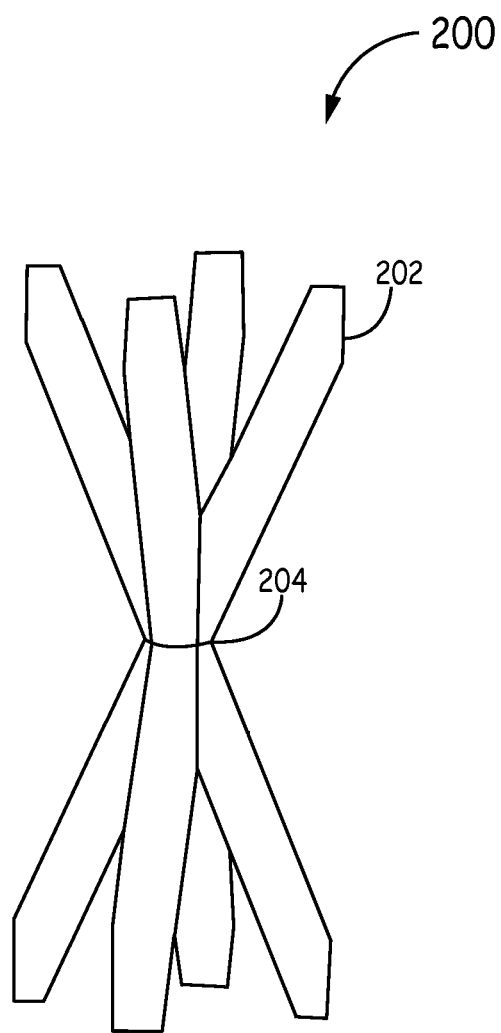
FIG. 2 is a diagram illustrating a section of truss elements used to construct a microlattice layer according to one embodiment.

FIG. 2 is a diagram illustrating a section 200 of a plurality of truss elements 202 that are used to form the microlattice supporting scaffolding. In at least one exemplary embodiment, the section 200 includes eight different truss elements 202 that are joined together at a node 204. The section 200 of truss elements 202 can include more or less than eight different truss elements 202 in other embodiments. As shown in FIG. 2, the truss elements 202 interpenetrate each other at the node 204 to form the section 200. The microlattice supporting scaffolding in microlattice layer 112 in FIG. 1 is formed by multiple sections 200 that are joined together to form a continuous lattice structure.

In one embodiment, multiple truss elements 202 in section 200 are formed continuously such that the interior of two conjoined truss elements 202, within the section 200, forms a contiguous void having no interior boundaries. When the interior of the different truss elements 202 lacks interior boundaries, the nodes 204 connecting the different truss elements 202 is made of the same material as the material used to fabricate the truss elements 202.

The truss elements 202 in section 200 have an intrinsically high strength due to the small size of the truss elements 202. Further, the truss elements 202 are configured to have a correspondingly small aspect ratio (e.g., length/diameter ratio) for withstanding a bending moment. Also, as microlattice layer 112 in FIG. 1 is formed from multiple conjoined sections of truss elements 200, microlattice layer 112 is able to withstand mechanical loads via axial tension and compression of the truss elements in section 200. Molecular alignment of the truss elements 202 along their respective axial directions lends additional strength and/or stiffness to the truss elements 202 and, accordingly, also to microlattice layer 112. Further, in at least one implementation, the truss elements 202 are configured to provide the microlattice layer 112 in FIG. 1 with a stretch-dominated behavior under a compression load applied to microlattice layer 112.

As illustrated in FIG. 2, truss elements 202 respectively extend in different directions away from node 204. For example, according to at least one embodiment, section 200 may include eight truss elements 202, each of which extends along a corresponding one of eight varying directions away from the node 204. In at least one implementation, the eight truss elements 202 interpenetrate one another at node 204 to form a section of continuous material.

In certain implementations, when multiple sections of truss elements 200 are joined together to form a microlattice layer, like microlattice layer 112 in FIG. 1, a significant portion of the microlattice layer 112 is free space. In certain implementations, the free space within the microlattice layer 112 is filled at least partially with a material different from the material of the microlattice structure itself. For example, the free space within microlattice layer 112 can be filled with a material that absorbs thermal energy, where the microlattice supporting scaffolding within microlattice layer 112 distributes the thermal energy substantially evenly throughout the absorbing material in the free space within microlattice layer 112.

In at least one embodiment, microlattice layer 112 is fabricated to absorb thermal energy by providing a metallic microlattice as a three-dimensional ordered open-cellular structure that functions as a scaffold. The open cells are then filled with a phase change material. Examples of suitable phase change materials are hydrocarbons, organic molecules, fatty acids, salt hydrates, bicarbonates of soda, and the like. In at least one implementation, an object is protected within the protection compartment by heat absorption material 104. For example, the heat absorption material 104 can be a phase change material that surrounds the protected object within the microlattice layer 112. Heat absorption material is further described in the following United States Patents all of which are incorporated by reference: U.S. Pat. No. 5,932,839, entitled "METHOD FOR DISSIPATING HEAT AWAY FROM HEAT SENSITIVE DEVICE USING BICARBONATE COMPOSITIONS" filed on Nov. 4, 1997, referred to herein as the '839 patent; U.S. Pat. No. 6,078,011, entitled "METHOD FOR DISSIPATING HEAT AWAY FROM A HEAT SENSITIVE DEVICE USING BICARBONATE COMPOSITION" filed on May 6, 1999, referred to herein as the '011 patent; and U.S. Pat. No. 6,899,161, entitled "METHOD FOR HEAT ABSORPTION USING POLYOXYMETHLENE POLYMER COMPOSITIONS" filed on Apr. 3, 2003, referred to herein as the '161 patent.

In certain embodiments, the protective compartment 102 and the microlattice layer 112 are enclosed within a flexible insulation layer 116. The flexible insulation layer 116 inhibits the transfer of heat through the flexible insulation layer 116 to protect objects within the protective compartment 102 from a heated environment containing the protective casing 100. For example, when the protective casing 100 is in a heated environment, the flexible insulation layer 116 inhibits the transfer of heat through the flexible insulation layer 116 to the microlattice layer 112. The heat that does get transferred through the flexible insulation layer 116, is absorbed by heat absorption material that is contained within the microlattice layer 112. The combination of the flexible insulation layer 116 and the microlattice layer 112 function jointly to inhibit heat in the environment of the protective casing 100 from damaging objects within the protective compartment 102.

Further, the combination of flexible insulation layer 116 and microlattice layer 112 function jointly to prevent shocks to the protective casing 100 from damaging objects within the protective compartment 102. In one exemplary implementation, the flexible insulation layer 116 comprises a layer of flexible aerogel or other flexible insulator. In at least one implementation the flexible aerogel layer 116 is PYROGEL XTF. Flexible insulation layer 116 is deformable and able to move in response to shocks. Further, microlattice layer 112 is also deformable and able to move in response to shocks. Due to the deformability and ability to absorb shocks of both the flexible insulation layer 116 and the microlattice layer 112, the flexible insulation layer 116 and microlattice layer 112 are able to absorb energy produced by shocks applied to the protective casing 100 and prevent the shocks from damaging objects within the protective compartment 102.

Further, to protect objects within the protective compartment 102 from further damage when the protective casing 100 is exposed to extreme conditions, the protective casing 100 can include outer protective layer 114. Outer protective layer 114 is a hard layer that is designed to withstand impacts at the high forces present in conditions like vehicle crashes, or falls from high elevations. For example, outer protective layer 114 can be fabricated from a metal, a composite material (e.g., a carbon composite), or the like. In certain implementations, the combination of the flexible insulation layer 116 and the microlattice layer 112, which both have shock absorbent qualities, allow for a thinner outer protective layer 114 than would be possible if the flexible insulation layer 116 was brittle and the microlattice layer 112 was not deformable. The thinner outer protective layer 114 reduces the size and weight of the protective casing 100. Thus, the combination of the outer protective layer 114, the flexible insulation layer 116, and the microlattice layer 112 function together to protect an object from forces present in extreme environments.

In certain embodiments, the protective casing 100 is designed to withstand the extreme environment that occurs during aircraft disasters. To ensure that the protective casing is able to withstand the extreme environment of an airplane crash, the protective casing 100 is rigorously tested. For example, the protective casing can be designed to withstand a crash impact of 3,400 Gs. The protective casing 100 can also be made resistant to penetration, as the most vulnerable axis of the protective casing 100 can be made to withstand the force caused by the drop of a 500 pound weight with a 0.25 square inch pin protruding from the bottom of the weight from a height of ten feet. Further, the protective casing 100 can also be made to withstand temperatures of 1100° C. for at least an hour. The protective casing 100 can also undergo other tests to determine the resistance of the protective casing 100 to pressure, liquid, and chemical forces that may be present in the event of an aircraft disaster. The components of the protective casing 100 function together to withstand the extreme environments that exist during an aircraft crash and the above described rigorous testing.

Figure 3:
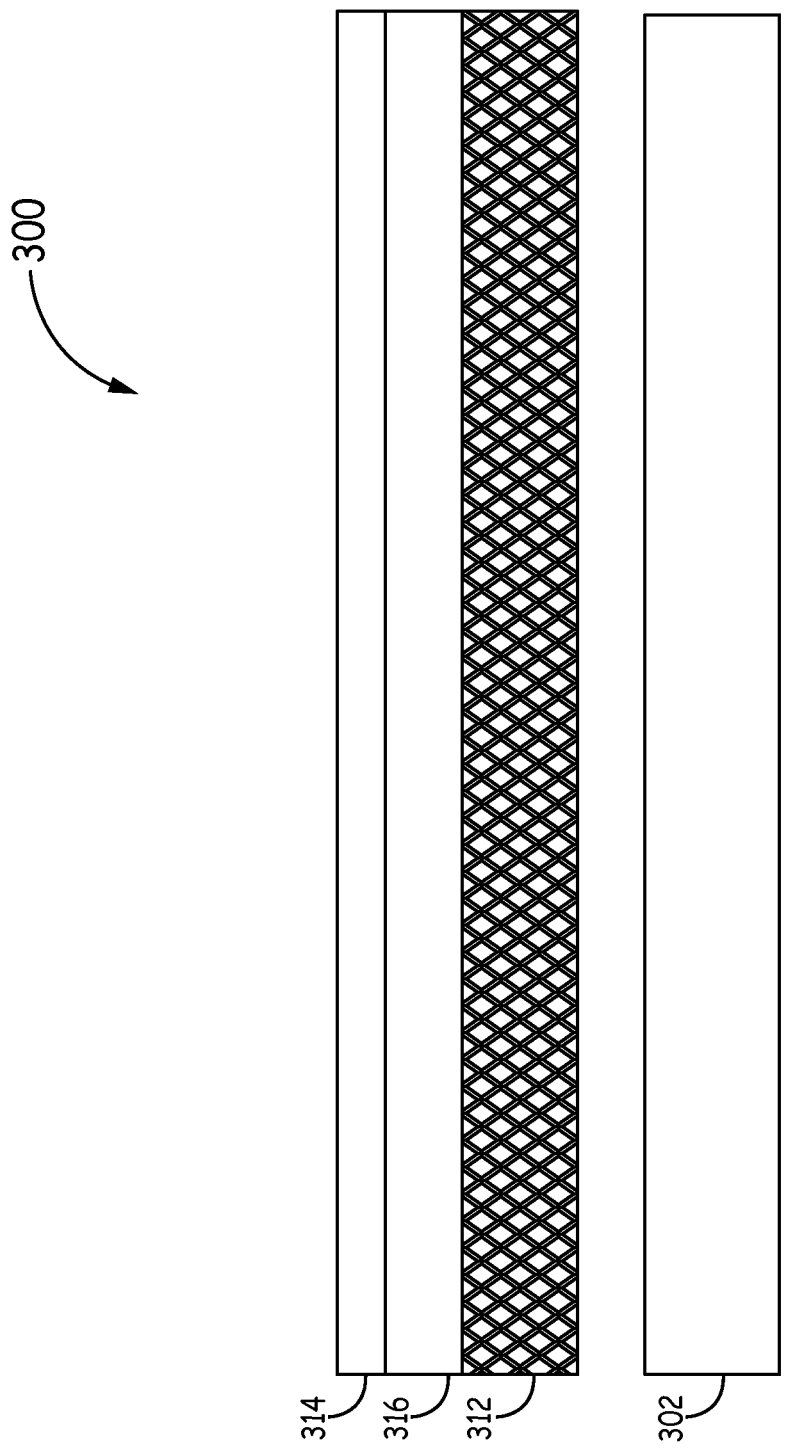
FIG. 3 is a block diagram illustrating a cross section of a protective casing according to one embodiment.

FIG. 3 is a block diagram illustrating a protective casing 300 that is designed to provide flexible protection to an object 302. In certain situations the object 302 to be protected by protective casing 300 flexes and moves. For example, a fireman or other user who works in an extreme environment may need protection from conditions present in the extreme environment. To protect the user, the protective casing 300 is implemented into clothing for the user. As described above, the protective casing 300, like protective casing 100, can include a microlattice layer 312 and a flexible insulation layer 316. Microlattice layer 312 and flexible insulation layer 316 function similarly to microlattice layer 112 and flexible insulation layer 116 in FIG. 1. As both microlattice layer 312 and flexible insulation layer 316 are bendable, they can be implemented into a flexible protective casing 300 such as a textile material.

In certain implementations, the protective casing 300 includes an outer protective layer 314. The outer protective layer 314 provides protection to the object 302 within the protective casing 300 according to the environment in which the user will primarily operate. For example, the outer protective layer 314 can provide further protection against heat. Alternatively, the outer protective layer 314 can be made from a puncture resistant material. Further, the outer protective layer 314 can be made from a waterproof material. In at least one implementation, the outer protective layer 314 is made from a composite material or multiple layers of materials that provide protection against multiple environments. In at least one embodiment, the outer protective layer 314 is on the sides of the protective casing 300 that are both nearest the object 302 and farthest from the object 302.

Figure 4:
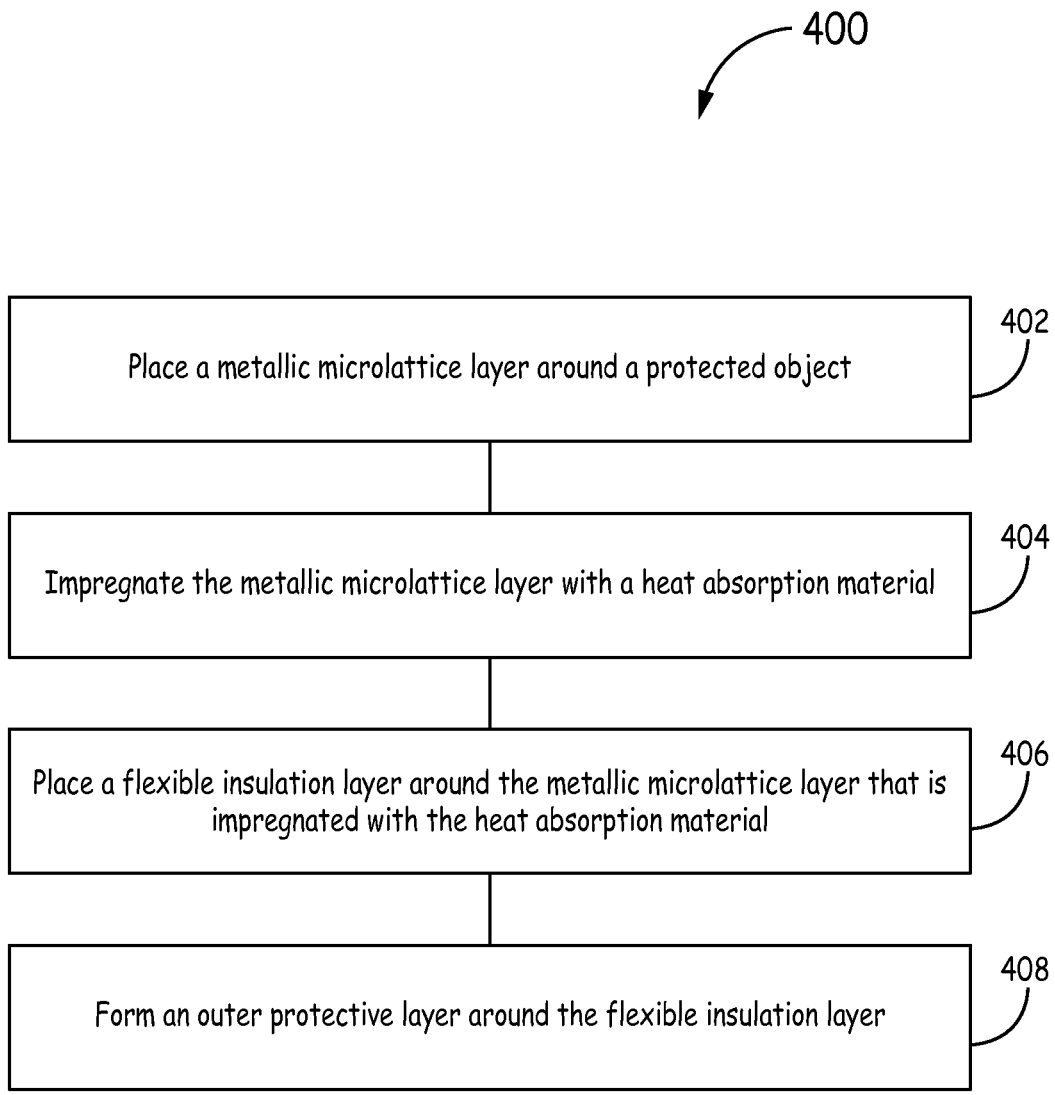
FIG. 4 is a flow diagram of a method for constructing a protective casing according to one embodiment.

FIG. 4 is a flow diagram of a method 400 for fabricating a protective casing according to one embodiment. Method 400 proceeds at 402 where a metallic microlattice layer is placed around a protected object. As discussed above, the metallic microlattice layer is a structure of truss elements that can provide a compressible scaffolding layer around the protected object. Method 400 proceeds at 404, where the metallic microlattice layer is impregnated with a heat absorption material. The heat absorption material can include a phase change material such as a bicarbonate of soda, or other phase change material. The metallic microlattice layer distributes heat throughout the heat absorption material to impede thermal energy from reaching the protected object.

Method 400 proceeds at 406 where a flexible insulation layer is placed around the metallic microlattice layer that is impregnated with the heat absorption material. For example, a layer of flexible aerogel can be placed around the metallic microlattice layer. The flexible aerogel impedes the transfer of heat from the external layers of a protective casing to the inner layers surrounding the protected object. Method 400 proceeds at 408 where an outer protective layer such as an impact resistant layer is formed around the flexible insulation layer. For example, the impact resistant layer absorbs shocks to the protective casing and encapsulates the metallic microlattice layer and the insulation layer. The combination of the multiple layers of the protective casing that surround the protected object protect the object from forces caused by extreme environments.

Example Embodiments

Example 1 includes a protective casing, comprising a microlattice layer configured to surround an object and impregnated with a heat absorbing material; a flexible insulation layer that surrounds the microlattice layer; and an outer protective layer that surrounds the flexible insulation layer.

Example 2 includes the protective casing of Example 1, wherein the heat absorbing material comprises at least one of a polymer; a silica gel; a binder; and a phase change material.

Example 3 includes the protective casing of Example 2, wherein the phase change material comprises at least one of a hydrocarbon; an organic chemical; a fatty acid; a salt hydrate; and a bicarbonate of soda.

Example 4 includes the protective casing of any of Examples 1-3, wherein the flexible insulation layer comprises at least one of an insulative wool; a foam; a flexible aerogel.

Example 5 includes the protective casing of any of Examples 1-4, wherein the outer protective layer comprises a metal.

Example 6 includes the protective casing of Example 5, wherein the outer protective layer is deformable.

Example 7 includes the protective casing of any of Examples 1-6, wherein the outer protective layer comprises a fabric.

Example 8 includes the protective casing of any of Examples 1-7, wherein the outer protective layer comprises a composite material.

Example 9 includes the protective casing of any of Examples 1-8, wherein the object is selected from the group consisting of a human; a scientific instrument; a data recorder; and a safe.

Example 10 includes a method for fabricating a protective casing, the method comprising placing a metallic microlattice layer around a protected object; impregnating the metallic microlattice layer with a heat absorption material; placing a flexible insulation layer around the metallic microlattice layer that is impregnated with the heat absorption material; and forming an outer protective layer around the flexible insulation layer.

Example 11 includes the method of Example 10, wherein the flexible insulation layer is comprised of a flexible aerogel.

Example 12 includes the method of any of Examples 10-11, wherein the heat absorption material comprises a phase change material.

Example 13 includes a protective casing, the casing comprising a flexible insulation layer configured to inhibit thermal energy from conducting from an external side of the flexible insulation layer to an internal side of the flexible insulation layer; a microlattice layer abutting the internal side of the flexible insulation layer, the microlattice layer configured to distribute thermal energy that passes through the flexible insulation layer substantially throughout the microlattice layer; and a heat absorbing material that impregnates the microlattice layer, the heat absorbing material configured to absorb the thermal energy in the microlattice layer.

Example 14 includes the protective casing of Example 13, further comprising an outer protective layer abutting the external side of the flexible insulation layer.

Example 15 includes the protective casing of Example 14, wherein the outer protective layer is configured to absorb impacts to the protective casing.

Example 16 includes the protective casing of any of Examples 14-15, wherein the outer protective layer is at least one of a textile material; a composite material; and a metal.

Example 17 includes the protective casing of any of Examples 13-16, wherein the heat absorbing material is a phase change material.

Example 18 includes the protective casing of any of Examples 13-17, further comprising an additional heat absorbing material that is encapsulated within the microlattice layer and enveloping the protected object.

Example 19 includes the protective casing of any of Examples 13-18, wherein the protective casing is configured to protect an object selected from the group consisting of a human; a scientific instrument; a data recorder; and a safe.

Example 20 includes the protective casing of any of Examples 13-19, wherein the flexible insulation layer is a flexible aerogel layer.

The present invention may be embodied in other specific forms without departing from its essential characteristics. The described embodiments are to be considered in all respects only as illustrative and not restrictive. The scope of the invention is therefore indicated by the appended claims rather than by the foregoing description. All changes that come within the meaning and range of equivalency of the claims are to be embraced within their scope.

What is claimed is:

1. A protective casing, comprising:
   a metallic microlattice layer configured to surround an object and impregnated with a heat absorbing material, wherein the metallic microlattice layer comprises a layer of supporting scaffolding formed by a plurality of conjoined sections of truss elements;
   a flexible insulation layer that surrounds the metallic microlattice layer; and
   an outer protective layer that surrounds the flexible insulation layer.

2. The protective casing of claim 1, wherein the heat absorbing material comprises at least one of:
   a polymer;
   a silica gel;
   a binder; and
   a phase change material.

3. The protective casing of claim 2, wherein the phase change material comprises at least one of:
   a hydrocarbon;
   an organic chemical;
   a fatty acid;
   a salt hydrate; and
   a bicarbonate of soda.

4. The protective casing of claim 1, wherein the flexible insulation layer comprises at least one of:
   an insulative wool;
   a foam;
   a flexible aerogel.

5. The protective casing of claim 1, wherein the outer protective layer comprises a metal.

6. The protective casing of claim 5, wherein the outer protective layer is deformable.

7. The protective casing of claim 1, wherein the outer protective layer comprises a fabric.

8. The protective casing of claim 1, wherein the outer protective layer comprises a composite material.

9. The protective casing of claim 1, wherein the object is selected from the group consisting of:
   a human;
   a scientific instrument;
   a data recorder; and
   a safe.

* * * * *